(12) United States Patent
Cai et al.

(10) Patent No.: US 12,033,246 B2
(45) Date of Patent: Jul. 9, 2024

(54) METHOD AND SYSTEM FOR SIMULTANEOUS QUANTITATIVE MULTIPARAMETRIC MAGNETIC RESONANCE IMAGING (MRI)

(71) Applicant: Xiamen University, Fujian (CN)

(72) Inventors: Shuhui Cai, Fujian (CN); Jian Wu, Fujian (CN); Congbo Cai, Fujian (CN)

(73) Assignee: XIAMEN UNIVERSITY, Fujian (CN)

( * ) Notice: Subject to any disclaimer, the term of this patent is extended or adjusted under 35 U.S.C. 154(b) by 751 days.

(21) Appl. No.: 17/090,246

(22) Filed: Nov. 5, 2020

(65) Prior Publication Data

US 2021/0134028 A1    May 6, 2021

(30) Foreign Application Priority Data

Nov. 6, 2019 (CN) .......................... 201911076119.6

(51) Int. Cl.
  G06T 11/00    (2006.01)
  G01R 33/54    (2006.01)
  G01R 33/56    (2006.01)
  G01R 33/561   (2006.01)

(52) U.S. Cl.
  CPC .......... *G06T 11/005* (2013.01); *G01R 33/543* (2013.01); *G01R 33/5602* (2013.01); *G01R 33/5608* (2013.01); *G01R 33/5616* (2013.01); *G06T 2210/41* (2013.01)

(58) Field of Classification Search
  CPC .............. G01R 33/543; G01R 33/5602; G01R 33/5608; G01R 33/5616; G06T 2210/41
  See application file for complete search history.

(56) References Cited

U.S. PATENT DOCUMENTS

| | | | |
|---|---|---|---|
| 10,635,943 B1 * | 4/2020 | Lebel | G06V 10/764 |
| 2017/0242087 A1 * | 8/2017 | Zho | G01R 33/5617 |
| 2017/0285123 A1 * | 10/2017 | Kaditz | G01R 33/5608 |
| 2020/0011951 A1 * | 1/2020 | Shi | G01R 33/56536 |
| 2020/0034998 A1 * | 1/2020 | Schlemper | G06F 17/18 |
| 2020/0058106 A1 * | 2/2020 | Lazarus | G06V 10/774 |
| 2020/0103483 A1 * | 4/2020 | Hardy | G01R 33/5608 |
| 2020/0249300 A1 * | 8/2020 | Sandino | G06N 3/084 |

(Continued)

FOREIGN PATENT DOCUMENTS

| | | |
|---|---|---|
| CN | 105232046 B | 1/2016 |
| CN | 107045115 A | 8/2017 |

(Continued)

*Primary Examiner* — Dixomara Vargas
(74) *Attorney, Agent, or Firm* — Nolte Lackenbach Siegel (57) ABSTRACT

A method and system for simultaneous quantitative multiparametric MRI are provided in the disclosure. The method includes: designing a magnetic resonance imaging (MRI) sequence which includes a signal excitation part, a shift gradient part, and a data acquisition part; generating training samples for a deep neural network according to the MRI sequence; training the deep neural network by using the training samples, to obtain a trained deep neural network; and reconstructing multiple magnetic-resonance parametric maps by using the trained deep neural network and k-space data acquired by the MRI sequence. The disclosure can implement quantitative multiparametric MRI, and can correct image distortions caused by magnetic field inhomogeneity.

8 Claims, 4 Drawing Sheets

(56) References Cited

U.S. PATENT DOCUMENTS

| | | | | |
|---|---|---|---|---|
| 2020/0264249 A1* | 8/2020 | Tayli | ............... | G01R 33/5608 |
| 2021/0033688 A1* | 2/2021 | Koch | ................. | G01R 33/56 |
| 2021/0090306 A1* | 3/2021 | Akcakaya | ......... | G01R 33/5611 |
| 2021/0149005 A1* | 5/2021 | Wang | ............... | G01R 33/5608 |

FOREIGN PATENT DOCUMENTS

| | | |
|---|---|---|
| CN | 108010100 A | 5/2018 |
| CN | 108663644 A | 10/2018 |

\* cited by examiner

METHOD AND SYSTEM FOR SIMULTANEOUS QUANTITATIVE MULTIPARAMETRIC MAGNETIC RESONANCE IMAGING (MRI)

CROSS REFERENCE TO RELATED APPLICATION

This application claims the priority of Chinese Patent Application No. CN201911076119.6, entitled "Method and System for Simultaneous Quantitative Multiparametric Magnetic Resonance Imaging (MRI)" filed with the China National Intellectual Property Administration on Nov. 6, 2019, which is incorporated herein by reference in its entirety.

TECHNICAL FIELD

The disclosure relates to the field of magnetic resonance imaging (MRI), and in particular, to a method and system for simultaneous quantitative multiparametric MRI.

BACKGROUND

Quantitative magnetic resonance imaging can implement quantitative measurement of some physiological parameters, and is of great significance for evaluation of clinical curative effect and grading diagnosis of diseases. However, a conventional quantitative magnetic resonance imaging method requires a long acquisition time, which greatly limits the application of the quantitative magnetic resonance imaging. Although techniques such as magnetic resonance fingerprinting have reduced the acquisition time of the quantitative magnetic resonance imaging to a level close to that of a conventional weighted magnetic resonance imaging, the quantitative magnetic resonance imaging methods still fail to be applied to quantitatively image tissues or organs with quick movement (for example, a beating heart or a pulsating organ) and various rapidly changing physiological parameters (for example, the brain blood-oxygen level or muscle lactate concentration). Hence, a series of methods for rapid quantitative magnetic resonance imaging based on overlapping echoes have been developed, including: CN107045115A, CN108663644A, CN105232046B, CN108010100A, and the like. Rapid quantitative magnetic resonance imaging based on overlapping echoes can complete acquisition of quantitative information within tens of milliseconds, and therefore has high resistance against motions and variations. However, the inventions above can only achieve quantitative measurement of one magnetic resonance parameter. To obtain multiple parameters, scanning needs to be performed multiple times. This increases the acquisition time to some extent and reduces the resistance against motions and variations. Besides, in the inventions above, the impact of magnetic field inhomogeneity on quantitative parametric imaging is not taken into consideration; therefore, an image obtained in a non-uniform magnetic field is distorted.

SUMMARY

The disclosure aims to provide a method and system for simultaneous quantitative multiparametric MRI, which can implement quantitative multiparametric MRI, and can correct image distortions caused by a non-uniform magnetic field.

To achieve above objective, the disclosure provides the following solutions:

A method for simultaneous quantitative multiparametric magnetic resonance imaging (MRI), including:
  S1: designing an MRI which includes a signal excitation part, a shift gradient part, and a data acquisition part;
  S2: generating training samples for a deep neural network according to the MRI sequence;
  S3: training the deep neural network by using the training samples, to obtain a trained deep neural network;
  S4: reconstructing multiple magnetic-resonance parametric maps by using the trained deep neural network and k-space data acquired by the MRI sequence.

Optionally, the signal excitation part includes multiple excitation pulses and is used to generate multiple echo signals; the shift gradient part includes multiple shift gradients and is used to refocus the multiple echo signals in expected positions in k-space; and the data acquisition part includes refocusing pulses, phase-encoding gradients and frequency-encoding gradients and is used to collect echo signals.

Optionally, the generating training samples for a deep neural network according to the MRI sequence specifically includes:
  S21: randomly generating a geometric figure in a blank rectangular template;
  S22: using the geometric figure as a mask, adding an optical image filtered by a filter function to the mask, and randomly assigning various magnetic resonance parameter values in the optical image;
  S23: generating geometric figures repeatedly, until the random geometric figures overlay the entire blank rectangular template, to obtain a virtual imaging object, where the virtual imaging object is jointly formed by multiple magnetic-resonance parametric templates;
  S24: modeling a magnetic field to obtain a magnetic field model;
  S25: modeling a radiofrequency field to obtain a radiofrequency field model;
  S26: acquiring data of the virtual imaging object by using the radiofrequency field model, the magnetic field model, and the MRI sequence, to obtain k-space data of the virtual imaging object;
  S27: performing Fourier transformation on the k-space data of the virtual imaging object, to obtain overlapped image(s) of the virtual imaging object;
  S28: forming a training sample by using the overlapped image(s) of the virtual imaging object and the multiple magnetic-resonance parametric templates; and
  S29: repeating S21 to S28, to generate a preset quantity of training samples.

Optionally, the training the deep neural network by using the training samples, to obtain a trained deep neural network specifically includes:
  inputting the training samples to the deep neural network to obtain output data;
  determining whether the number of iterations of the deep neural network reaches a preset value and an error between the output data and target data converges; and
  if so, determining that the deep neural network is the trained deep neural network; or
  if not, continuing training the deep neural network.

Optionally, the reconstructing multiple magnetic-resonance parametric maps by using the trained deep neural network and k-space data acquired by the MRI sequence specifically includes:

acquiring data of an actual imaging object by using the MRI sequence, to obtain k-space data of the actual imaging object;

performing Fourier transformation on the k-space data of the actual imaging object, to obtain overlapped image(s) of the actual imaging object; and reconstructing the overlapped image(s) of the actual imaging object by using the trained deep neural network, to obtain multiple magnetic-resonance parametric maps.

Optionally, the modeling a magnetic field to obtain a magnetic field model specifically includes:

modeling the magnetic field to obtain a magnetic field model $B_0$:

$$B_0 = amp_0 \times (a_0 X + b_0 Y + c_0 XY + d_0 X^2 + e_0 Y^2 + f_0 XY^2 + g_0 X^2 Y)$$

where $amp_0$ controls the deviation degree of the $B_0$ field; $a_0$, $b_0$, $c_0$, $d_0$, $e_0$, $f_0$, and $g_0$ obey a uniform distribution in a range of $[-0.5, 0.5]$; X and Y are coordinate values of a rectangular template of $B_0$ after normalization, and are within a range of $[-1, 1]$.

Optionally, the modeling a radiofrequency field to obtain a radiofrequency field model specifically includes:

modeling the radiofrequency field to obtain a radiofrequency field model $B_1$:

$$B_1 = amp_1 \times (a_1 X + b_1 Y + c_1 XY + d_1 X^2 + e_1 Y^2) + f_1 + 1$$

where $amp_1$ represents the amplitude of $B_1$, which obeys a uniform distribution in a range of $[0, 0.6]$; $a_1$ and $b_1$ obey a Gaussian distribution with an average value of 0 and a variance of 0.5; $c_1$, $d_1$, and $e_1$ obey a uniform distribution in a range of $[-0.5, 0.5]$; $f_1$ obeys a uniform distribution in a range of $[-0.05, 0.05]$; X and Y are coordinate values of a rectangular template of $B_1$ after normalization, and are within a range of $[-1, 1]$.

A system for simultaneous quantitative multiparametric MRI, including:

an MRI sequence designing module, configured to design an MRI sequence which includes a signal excitation part, a shift gradient part, and a data acquisition part;

a training sample generating module, configured to generate training samples for a deep neural network according to the MRI sequence;

a network training module, configured to train the deep neural network by using the training samples, to obtain a trained deep neural network; and an image reconstruction module, configured to reconstruct multiple magnetic-resonance parametric maps using the trained deep neural network and k-space data acquired by the MRI sequence.

Optionally, the training sample generating module specifically includes:

a geometric figure generating unit, configured to randomly generate a geometric figure in a blank rectangular template;

an optical image adding unit, configured to use the geometric figure as a mask, add an optical image filtered by a filter function to the mask, and randomly assign various magnetic resonance parameter values in the optical image;

a virtual imaging object determining unit, configured to overlay the entire blank rectangular template with random geometric figures, to obtain a virtual imaging object, where the virtual imaging object is jointly formed by multiple magnetic-resonance parametric templates;

a magnetic field model establishing unit, configured to model a magnetic field to obtain a magnetic field model;

a radiofrequency field model establishing unit, configured to model a radiofrequency field to obtain a radiofrequency field model;

a simulated data acquisition unit, configured to acquire data of the virtual imaging object by using the radiofrequency field model, the magnetic field model, and the MRI sequence, to obtain k-space data of the virtual imaging object;

a Fourier transformation unit, configured to perform Fourier transformation on the k-space data of the virtual imaging object, to obtain overlapped image(s) of the virtual imaging object;

a single training sample forming unit, configured to form a training sample by using the overlapped image(s) of the virtual imaging object and the multiple magnetic-resonance parametric templates; and a training sample generating unit, configured to generate a preset quantity of training samples.

Optionally, the image reconstruction module specifically includes:

an actual data acquisition unit, configured to acquire data of an actual imaging object by using the MRI sequence, to obtain k-space data of the actual imaging object;

an actual overlapped image determining unit, configured to perform Fourier transformation on the k-space data of the actual imaging object, to obtain overlapped image(s) of the actual imaging object; and a unit for determining multiple magnetic-resonance parametric maps, configured to reconstruct the overlapped image(s) of the actual imaging object by using the trained deep neural network, to obtain multiple magnetic-resonance parametric maps.

According to specific examples provided in the disclosure, the disclosure discloses the following technical effects:

1. The disclosure implements simultaneous quantitative imaging of $T_2$ and $T_2^*$.
2. Parametric maps obtained in the disclosure have high precision.
3. The disclosure effectively corrects distortions existing in rapid quantitative magnetic resonance imaging based on overlapping echoes.

BRIEF DESCRIPTION OF THE DRAWINGS

In order to illustrate the examples of the disclosure or the technical solutions of the prior art, the accompanying drawings to be used will be described briefly below. Notably, the following accompanying drawings merely illustrate some examples of the disclosure, and those of ordinary skill in the art can further obtain other accompanying drawings based on the accompanying drawings without any creative efforts.

DETAILED DESCRIPTION

The following clearly and completely describes the technical solutions in the examples of the disclosure with reference to the accompanying drawings in the examples of the disclosure. Apparently, the described examples are merely some rather than all of the examples of the disclosure. All other examples obtained by a person of ordinary skill in the art based on the examples of the disclosure without creative efforts shall fall within the protection scope of the disclosure.

The objective of the disclosure is to provide a method and system for simultaneous quantitative multiparametric MRI, which can implement quantitative multiparametric MRI, and can correct image distortions caused by a non-uniform magnetic field.

To make the foregoing objective, features, and advantages of the disclosure clearer and more comprehensible, the disclosure is further described in detail below with reference to the accompanying drawings and specific examples.

Figure 1:
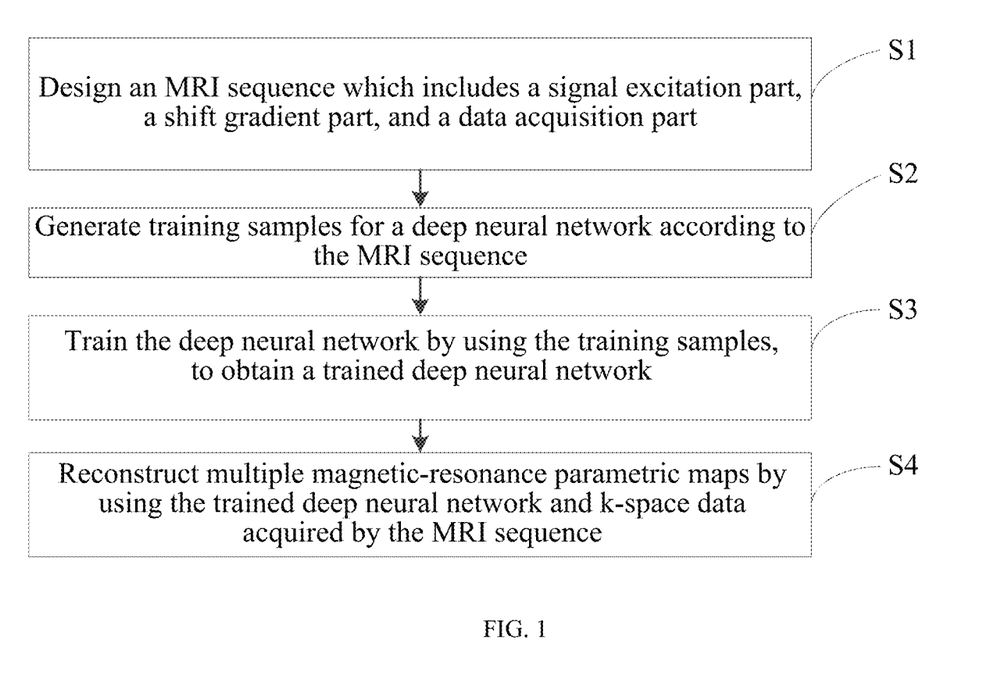
FIG. 1 is a flowchart of a method for simultaneous quantitative multiparametric MRI according to the disclosure.

FIG. 1 is a flowchart of a method for simultaneous quantitative multiparametric MRI according to the disclosure. As shown in FIG. 1, a method for simultaneous quantitative multiparametric MRI includes the following steps:

S1: design an MRI sequence which includes a signal excitation part, a shift gradient part, and a data acquisition part.

The signal excitation part includes multiple excitation pulses and is used to generate multiple echo signals; The flip angle of the excitation pulse, the quantity of the excitation pulses, and the time interval between the excitation pulses are set according to actual requirements.

The shift gradient part includes multiple shift gradients and is used to refocus the multiple echo signals in expected positions in k-space. The position, value and direction of each shift gradient is determined according to actual requirements.

The data acquisition part includes refocusing pulses, phase-encoding gradients and frequency-encoding gradients and is used to collect echo signals. The values and directions of the phase-encoding gradients and frequency-encoding gradients in the data acquisition part, whether to use refocusing pulses, and the moments of applying refocusing pulses are determined according to actual requirements.

To simultaneously obtain signals having different $T_2$ and $T_2^*$ weights in an extremely short time, the imaging sequence obtains a series of echo signals by continuously applying small flip angle excitation pulses. Shift gradients need to be applied between the excitation pulses, to refocus the echo signals to different positions in the same k-space. The imaging sequence uses two readout modules. 180° refocusing pulse is applied before the first readout module; therefore, signals acquired by the first readout module are mainly $T_2$-weighted signals. The second readout module is located after the first readout module, and signals acquired by the second readout module are mainly $T_2^*$-weighted signals. In the phase-encoding direction, the two readout modules adopt gradients with equal values and opposite directions. In the frequency-encoding direction, gradients adopted by the two readout modules are exactly the same. Due to the presence of magnetic field inhomogeneity and the opposite directions of the adopted phase-encoding gradients, the two acquired images have opposite distortions in the phase-encoding direction. A deep neural network can correct the images by using this characteristic.

S2: generate training samples for a deep neural network.

S3: train the deep neural network by using the training samples, to obtain a trained deep neural network. S3 specifically includes:

input the training samples to the deep neural network to obtain output data;

determine whether the number of iterations of the deep neural network reaches a preset value and an error between the output data and target data converges; and if so, determine that the deep neural network is the trained deep neural network; or if not, continue training the deep neural network.

S4: reconstruct multiple magnetic-resonance parametric maps by using the trained deep neural network and k-space data acquired by the MRI sequence. S4 specifically includes:

acquiring data of an actual imaging object by using the MRI sequence, to obtain k-space data of the actual imaging object;

performing Fourier transformation on the k-space data of the actual imaging object, to obtain overlapped image(s) of the actual imaging object; and reconstructing the overlapped image(s) of the actual imaging object according to the trained deep neural network, to obtain multiple magnetic-resonance parametric maps.

Figure 2:
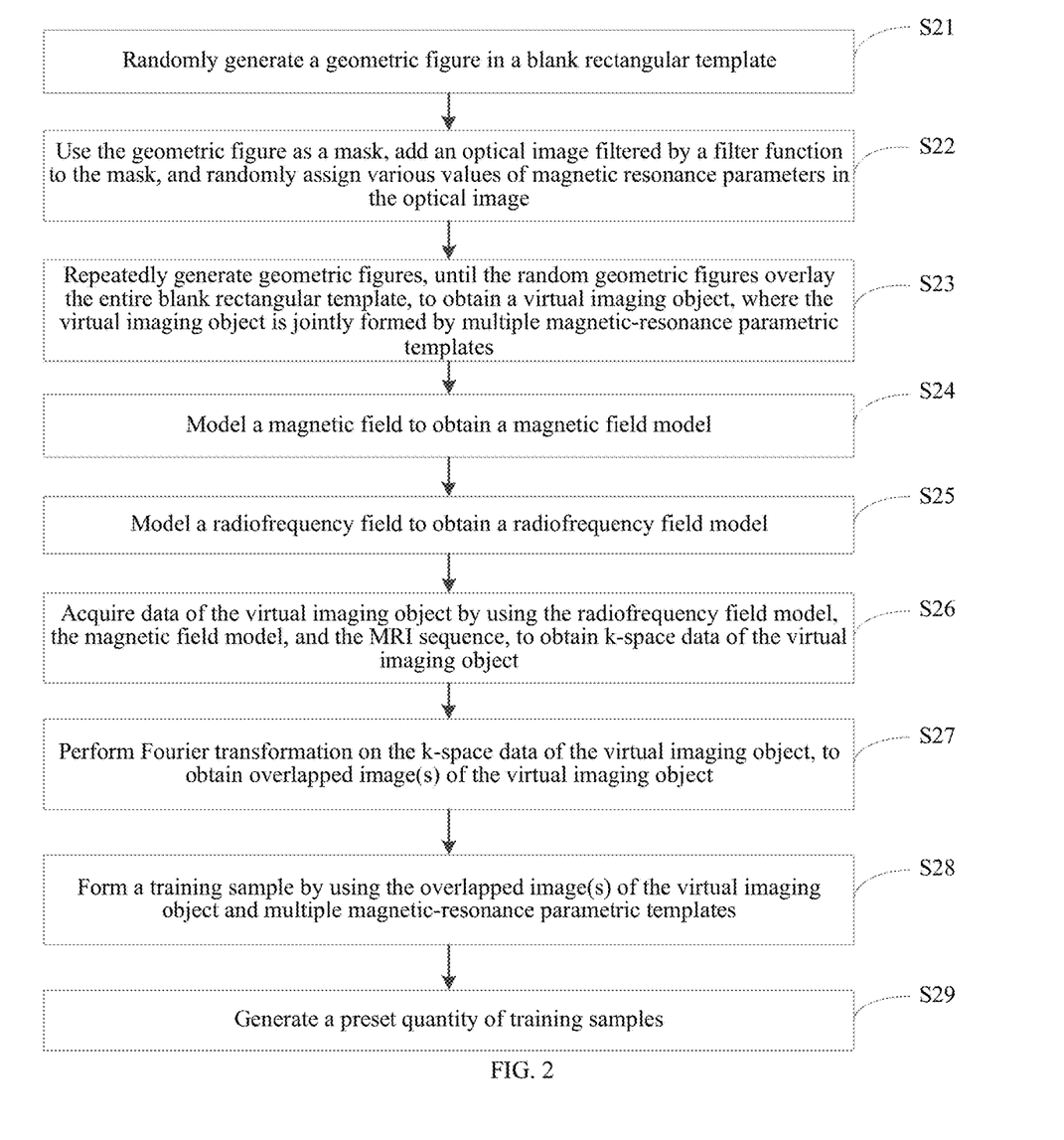
FIG. 2 is a flowchart of generating training samples for a deep neural network according to the disclosure.

FIG. 2 is a flowchart of generating training samples for a deep neural network according to the disclosure. As shown in FIG. 2, the generating training samples for a deep neural network specifically includes the following steps:

S21: randomly generate a geometric figure in a blank rectangular template. The position and size of the geometric figure are determined randomly. The geometric figure simulates a local structure of an imaging object. Therefore, in the process of repeating step S21, geometric figures may overlap with each other. If the overlap occurs, the overlapping part is removed through a set subtraction operation, and the remaining part is used as a new mask.

S22: use the geometric figure as a mask, add an optical image filtered by a filter function to the mask, and randomly assign various magnetic resonance parameter values in the optical image. The optical image simulates local texture of the imaging object, and has random values of magnetic resonance parameters $T_1$, $T_2$, $T_2^*$, and $M_0$. $T_1$ represents the longitudinal relaxation time, $T_2$ represents the transverse relaxation time without being affected by magnetic field inhomogeneity, $T_2^*$ represents the transverse relaxation time affected by magnetic field inhomogeneity, and $M_0$ represents the relative proton density. In the process of simulating local texture of the imaging object by using the optical image, values of magnetic resonance parameters ($T_1$, $T_2$, $T_2^*$, $M_0$) in the mask are determined randomly, and then the parameter values are adjusted on the basis of such numerical values by using the filtered optical image. Preferably, the random parameters conform to actual parameter distributions of the actual imaging object.

S23: generate geometric figures repeatedly, until the random geometric figures overlay the entire blank rectangular template, to obtain a virtual imaging object, where the virtual imaging object is jointly formed by multiple magnetic-resonance parametric templates. Specifically, the virtual imaging object is jointly formed by a series of magnetic-resonance parametric templates ($T_1$, $T_2$, $T_2^*$, $M_0$).

S24: model a magnetic field to obtain a magnetic field model, so as to simulate a non-uniform magnetic field in an instrument during a practical sampling process of the MRI sequence. S24 specifically includes:

modeling the magnetic field to obtain a magnetic field model $B_0$:

$$B_0 = amp_0 \times (a_0 X + b_0 Y + c_0 XY + d_0 X^2 + e_0 Y^2 + f_0 XY^2 + g_0 X^2 Y)$$

where $amp_0$ controls the deviation degree of the $B_0$ field; $a_0$, $b_0$, $c_0$, $d_0$, $e_0$, $f_0$, and $g_0$ obey a uniform distribution in a range of [−0.5, 0.5]; X and Y are coordinate values of a rectangular template of $B_0$ after normalization, and are within a range of [−1, 1].

S25: model a radiofrequency field to obtain a radiofrequency field model, so as to simulate a non-uniform radiofrequency field in the instrument during the practical sampling process of the magnetic resonance imaging. S25 specifically includes: modeling the radiofrequency field to obtain a radiofrequency field model $B_1$:

$$B_1 = amp_1 \times (a_1 X + b_1 Y + c_1 XY + d_1 X^2 + e_1 Y^2) + f_1 + 1$$

where $amp_1$ represents the amplitude of $B_1$, which obeys a uniform distribution in a range of [0, 0.6]; $a_1$ and $b_1$ obey a Gaussian distribution with an average value of 0 and a variance of 0.5; $c_1$, $d_1$, and $e_1$ obey a uniform distribution in a range of [−0.5, 0.5]; $f_1$ obeys a uniform distribution in a range of [−0.05, 0.05]; X and Y are coordinate values of a rectangular template of $B_1$ after normalization, and are within a range of [−1, 1].

S26: acquire data of the virtual imaging object by using the radiofrequency field model, the magnetic field model, and the MRI sequence, to obtain k-space data of the virtual imaging object.

S27: perform Fourier transformation on the k-space data of the virtual imaging object, to obtain overlapped image(s) of the virtual imaging object. The image is overlapped because the same image contains multiple images having different phase shifts and parameter-weighted information.

S28: form a training sample by using the overlapped image(s) of the virtual imaging object and the multiple magnetic-resonance parametric templates.

S29: repeat S21 to S28, to generate a preset quantity of training samples.

Figure 3:
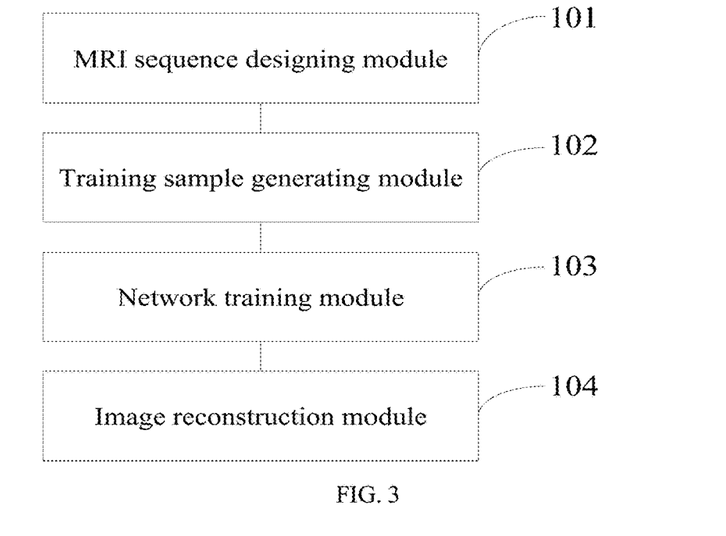
FIG. 3 is a structural diagram of a system for simultaneous quantitative multiparametric MRI according to the disclosure.

FIG. 3 is a structural diagram of a system for simultaneous quantitative multiparametric MRI according to the disclosure. As shown in FIG. 3, a system for simultaneous quantitative multiparametric MRI includes:

an MRI sequence designing module 101, configured to design an MRI sequence which comprises a signal excitation part, a shift gradient part, and a data acquisition part; a training sample generating module 102, configured to generate training samples for a deep neural network according to the MRI sequence;

a network training module 103, configured to train the deep neural network by using the training samples, to obtain a trained deep neural network; and an image reconstruction module 104, configured to reconstruct multiple magnetic-resonance parametric maps using the trained deep neural network and k-space data acquired by the MRI sequence.

The training sample generating module 102 specifically includes:

- a geometric figure generating unit, configured to randomly generate a geometric figure in a blank rectangular template;
- an optical image adding unit, configured to use the geometric figure as a mask, add an optical image filtered by a filter function to the mask, and randomly assign various magnetic resonance parameter values in the optical image;
- a virtual imaging object determining unit, configured to overlay the entire blank rectangular template with random geometric figures, to obtain a virtual imaging object;
- a magnetic field model establishing unit, configured to model a magnetic field to obtain a magnetic field model;
- a radiofrequency field model establishing unit, configured to model a radiofrequency field to obtain a radiofrequency field model;
- a simulated data acquisition unit, configured to acquire data of the virtual imaging object by using the radiofrequency field model, the magnetic field model, and the MRI sequence, to obtain k-space data of the virtual imaging object;
- a Fourier transformation unit, configured to perform Fourier transformation on the k-space data of the virtual imaging object, to obtain overlapped image(s) of the virtual imaging object;
- a single training sample forming unit, configured to form a training sample by using the overlapped image(s) of the virtual imaging object and the multiple magnetic-resonance parametric templates; and
- a training sample generating unit, configured to generate a preset quantity of training samples.

The image reconstruction module 104 specifically includes:

- an actual data acquisition unit, configured to acquire data of an actual imaging object by using the MRI sequence, to obtain k-space data of the actual imaging object;
- an actual overlapped image determining unit, configured to perform Fourier transformation on the k-space data of the actual imaging object, to obtain overlapped image(s) of the actual imaging object; and
- a unit for determining multiple magnetic-resonance parametric maps, configured to reconstruct the overlapped image(s) of the actual imaging object according to the trained deep neural network, to obtain multiple magnetic-resonance parametric maps.

The magnetic field model establishing unit specifically includes:

a magnetic field model establishing sub-unit, configured to model the magnetic field to obtain a magnetic field model $B_0$:

$$B_0 = amp_0 \times (a_0 X + b_0 Y + c_0 XY + d_0 X^2 + e_0 Y^2 + f_0 XY^2 + g_0 X^2 Y)$$

where $amp_0$ controls the deviation degree of the $B_0$ field; $a_0$, $b_0$, $c_0$, $d_0$, $e_0$, $f_0$, and $g_0$ obey a uniform distribution in a range of [−0.5, 0.5]; X and Y are coordinate values of a rectangular template of $B_0$ after normalization, and are within a range of [−1, 1].

The radiofrequency field model establishing unit specifically includes: a radiofrequency field model establishing sub-unit, configured to model the radiofrequency field to obtain a radiofrequency field model $B_1$:

$$B_1 = amp_1 \times (a_1 X + b_1 Y + c_1 XY + d_1 X^2 + e_1 Y^2) + f_1 + 1$$

where $amp_1$ represents the amplitude of $B_1$, which obeys a uniform distribution in a range of [0, 0.6]; $a_1$ and $b_1$ obey a Gaussian distribution with an average value of 0 and a variance of 0.5; $c_1$, $d_1$, and $e_1$ obey a uniform distribution in a range of [−0.5, 0.5]; $f_1$ obeys a uniform distribution in a range of [−0.05, 0.05]; X and Y are coordinate values of a rectangular template of $B_1$ after normalization, and are within a range of [−1, 1].

Example:

Step 1: design an MRI sequence. For the design of the MRI sequence, reference may be made to FIG. 4. To simultaneously obtain signals having different $T_2$ and $T_2^*$ weights in an extremely short time, the imaging sequence obtains a series of echo signals by continuously applying small flip angle excitation pulses. Shift gradients need to be applied between the excitation pulses, to refocus the echo signals to different positions in the same k-space. Two readout modules are used in the sampling stage to acquire signals. 180° refocusing pulse is applied before the first readout module; therefore, signals acquired by the first readout module are mainly $T_2$-weighted signals. Signals acquired by the second readout module are mainly $T_2^*$-weighted signals. In addition, in the phase-encoding direction, the two readout modules adopt gradients with equal values and opposite directions. Due to the presence of magnetic field inhomogeneity and the opposite directions of the adopted phase-encoding gradients, two acquired images have opposite distortions in the phase-encoding direction. A deep neural network can correct the images by using this characteristic.

Figure 5:
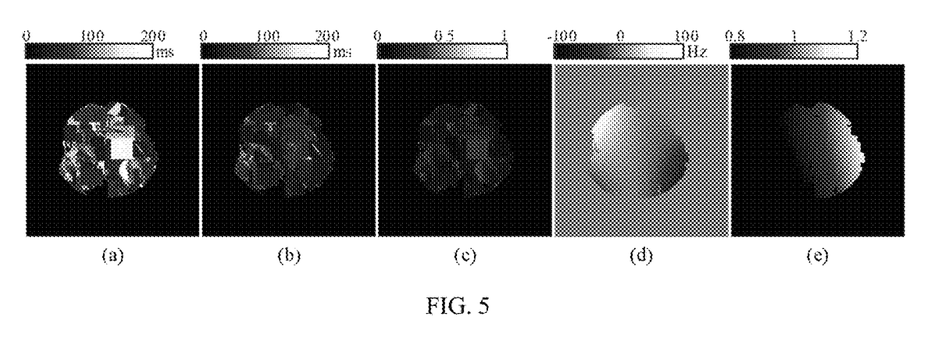
FIG. 5 is a schematic diagram of generated random parametric templates according to the disclosure.

Step 2: generate training samples for a deep neural network. For random magnetic-resonance parametric templates corresponding to a virtual imaging object generated randomly, reference may be made to FIG. 5. FIG. 5 is a schematic diagram of generated random parametric templates according to the disclosure. (a) is a $T_2$ template, (b) is a $T_2^*$ template, (c) is an $M_0$ template, (d) is a $B_0$ template, (e) is a $B_1$ template. The virtual imaging object is jointly formed by a series of magnetic-resonance parametric templates ($T_1$, $T_2$, $T_2^*$, $M_0$). For the non-uniform magnetic field and radiofrequency field generated randomly, reference may also be made to FIG. 5. Then, a sampling process of the imaging sequence is simulated by using a computer, to obtain k-space data corresponding to the virtual imaging object. Finally, Fourier transformation is performed on the k-space data to obtain overlapped image(s). The overlapped image(s) and the corresponding random magnetic-resonance parametric templates form a training sample. A process of generating training samples includes the following steps:

Step 2.1: randomly generate a geometric figure in a blank rectangular template, for example, a triangle, a rectangle, or a circle. The position and size of the geometric figure are determined randomly.

Step 2.2: use the geometric figure as a mask, and add an optical image filtered by a Gaussian function to the mask. The optical image simulates local texture of an imaging object, and has random values of magnetic resonance parameters $T_1$, $T_2$, $T_2^*$, and $M_0$.

Step 2.3: continuously repeat steps 2.1 and 2.2, until the random geometric figures overlay the entire blank rectangular template, to obtain a virtual imaging object.

Step 2.4: model a magnetic field $B_0$ by using a polynomial, to simulate non-uniform $B_0$ in an instrument during a practical sampling process of the MRI sequence:

$$B_0 = amp_0 \times (a_0 X + b_0 Y + c_0 XY + d_0 X^2 + e_0 Y^2 + f_0 XY^2 + g_0 X^2 Y)$$

where $amp_0$ controls the deviation degree of the $B_0$ field; $a_0$, $b_0$, $c_0$, $d_0$, $e_0$, $f_0$, and $g_0$ obey a uniform distribution in a range of $[-0.5, 0.5]$; X and Y are coordinate values of a rectangular template of $B_0$ after normalization, and are within a range of $[-1, 1]$.

Step 2.5: model a radiofrequency field $B_1$ by using a polynomial, to simulate non-uniform $B_1$ in the instrument during the practical sampling process of the MRI sequence:

$$B_1 = amp_1 \times (a_1 X + b_1 Y + c_1 XY + d_1 X^2 + e_1 Y^2) + f_1 + 1$$

where $amp_1$ represents the amplitude of $B_1$, which satisfies a uniform distribution in a range of $[0, 0.6]$; $a_1$ and $b_1$ obey a Gaussian distribution with an average value of 0 and a variance of 0.5; $c_1$, $d_1$, and $e_1$ obey a uniform distribution in a range of $[-0.5, 0.5]$; $f_1$ obeys a uniform distribution in a range of $[-0.05, 0.05]$; X and Y are coordinate values of a rectangular template of $B_1$ after normalization, and are within a range of $[-1, 1]$.

Step 2.6: simulate, by using a computer, the imaging sequence designed in step 1, and at the same time take into account of the magnetic field $B_0$ generated in step 2.4 and the radio frequency field $B_1$ generated in step 2.5, to acquire data of the virtual imaging object generated in step 2.3 and obtain k-space data.

Step 2.7: perform Fourier transformation on the k-space data obtained in step 2.6, to obtain overlapped image(s). The image is overlapped because the same image contains multiple images having different phase shifts and parameter-weighted information. The overlapped image(s) and the corresponding random magnetic-resonance parametric templates form a training sample.

Step 2.8: repeat step 2.1 to step 2.7, to generate a preset quantity of training samples.

Step 3: train the deep neural network. The deep neural network is trained by using the training samples generated in step 2.

Step 4: reconstruct, by using the trained deep neural network obtained in step 3, parametric maps for the k-space data acquired from the actual imaging object by using the imaging sequence designed in step 1.

Preferably, in step 1, a flip angle of the used excitation pulse is 30°.

Preferably, in step 1, sizes of the used shift gradients are $(G_{RO1}, G_{PE1})=(-22/128, -2/8)$, $(G_{RO2}, G_{PE2})=(11/128, -2/8)$, $(G_{RO3}, G_{PE3})=(-22/128, -2/8)$, and $(G_{RO4}, G_{PE4})=(-48/128, -1/8)$. It is assumed that the size of a readout gradient in the readout module is 1.

Figure 4:
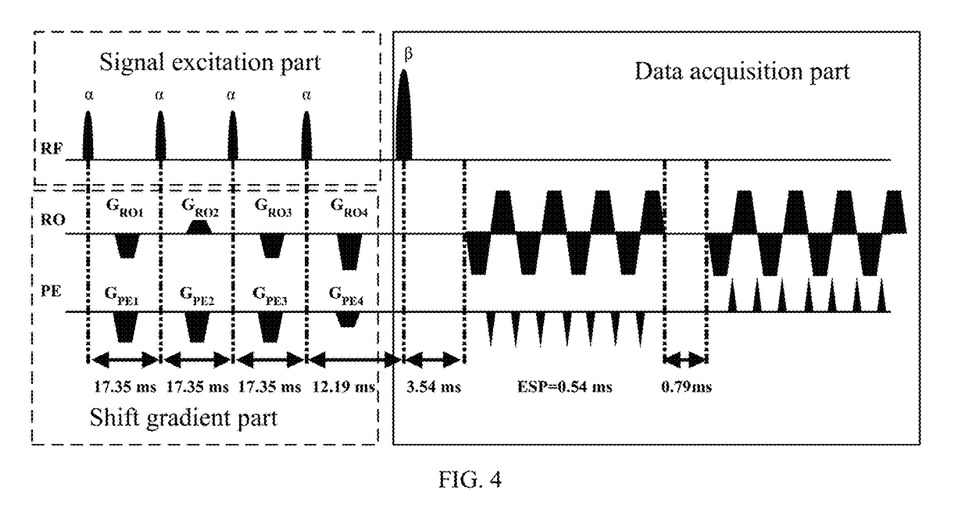
FIG. 4 is a diagram of an MRI sequence according to the disclosure.

Preferably, in step 1, time intervals are as shown in FIG. 4. FIG. 4 is a diagram of an MRI sequence according to the disclosure.

Preferably, in step 2, a template matrix size is 500×500.

Preferably, in step 2.1, the position and size of the geometric figure are determined randomly. Therefore, in the process of repeating step 2.1, geometric figures may overlap with each other. If the overlap occurs, the overlapping part is removed through a set subtraction operation, and the remaining part is used as a new mask. For example, masks generated in two consecutive steps are A and B respectively. If the mask A overlaps with the mask B, the new mask B is modified to be $B'=B-A=\{x|x\in B, \text{ and } x\cup A\}$ (x represents a pixel point in the template).

Preferably, in step 2, the magnetic resonance parameters conform to actual parameter distributions of the actual imaging object. Parameter values are preferably as follows: values of $T_2$ are uniformly distributed in a range of [20 ms, 300 ms], the value of $T_1$ is set to 2000 ms, values of $T_2^*$ are less than or equal to the values of $T_2$, and values of $M_0$ are uniformly distributed in a range of [0, 1]. The value of $T_1$ is set to 2000 ms, because values of $T_1$ of actual imaging objects are generally greater than 500 ms, and as long as the value of $T_1$ is greater than 500 ms, the value of $T_1$ barely has any impact on reconstruction of $T_2$ and $T_2^*$.

Preferably, in step 2, parameter values satisfying the foregoing distributions are randomly selected for the mask, and then the parameter values are adjusted by using the filtered optical image. A preferred adjustment method is to calculate a weighted sum of the foregoing random parameter value (Ran$_a$) and the filtered optical image (Ran$_b$). An ultimate adjustment method for the parameter values is preferably 0.4×Ran$_a$+0.6×Ran$_d$/(Ran$_b$/255).

Preferably, in step 2, during numerical simulation of the T$_2$* effect, a large number of protons need to be added into the same voxel. As the number of protons increases, higher simulation precision can be achieved, but a longer computing time is required. In this example, the number of protons is preferably 150.

Preferably, in step 2.4, the value of amp$_0$ is set to 1500. In this case, a maximum deviation of the B$_0$ field is approximately 100 Hz.

Preferably, in step 3, the deep neural network is a U-Net.

Preferably, in step 3, the training samples need to be normalized. Because there are two readout modules, each training sample has two pieces of k-space data. First, each piece of k-space data is padded with zero, to expand the size to 256×256; then Fourier transformation is performed to obtain two overlapped images; next, overlapped images of all samples are searched to obtain the maximum amplitude; finally, the overlapped images of all samples are divided by the maximum amplitude.

Preferably, in step 3, an input of the deep neural network has separated real and imaginary parts, that is, the input of the deep neural network includes four images: two real-part images and two imaginary-part images.

Preferably, in step 3, the deep neural network adopts Li norm to constrain the training error of the network; the quantity of the training samples is 2000, the block size is 64×64, and the number of iterations is 200000.

Preferably, in step 4, the k-space data of the imaging object is acquired by using the GRAPPA technique, where the acceleration factor is 2, the number of reference lines is 24, the field of view is 220×220 mm$^2$, the slice thickness is 4 mm, and the sampling matrix size is 128×128. GRAPPA reconstruction is first performed on the acquired two pieces of k-space data; then, each of the reconstructed k-space data is padded with zero, to expand the size to 256×256; next, Fourier transformation is performed to obtain two overlapped images; finally, the overlapped images are inputted to the trained deep neural network obtained in step 3, to reconstruct multiple magnetic-resonance parametric maps.

Figure 6:
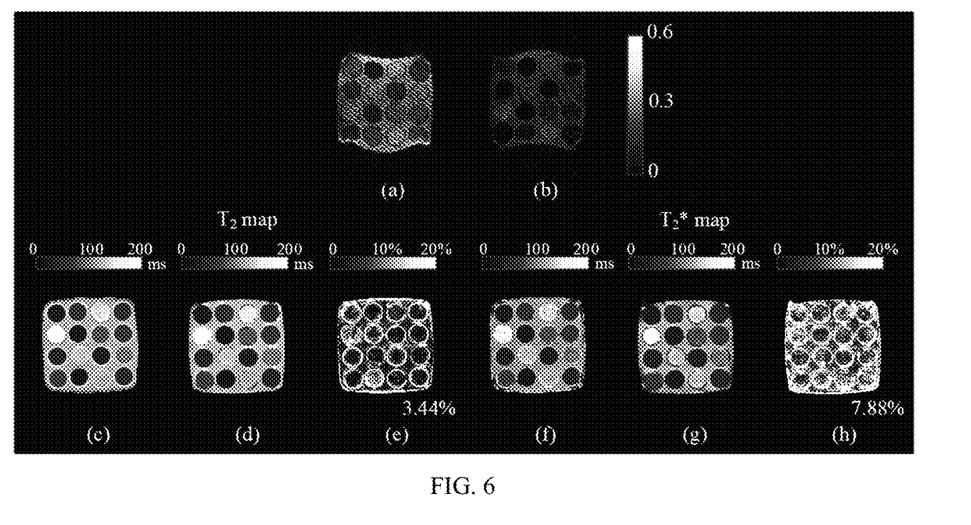
FIG. 6 shows a reconstruction result of parametric maps of a water phantom according to the disclosure.

FIG. 6 shows a reconstruction result of parametric maps of a water phantom according to the disclosure. Reconstructed water phantom images and corresponding error maps can be learned from FIG. 6. (a) is the amplitude image of the first overlapped image, (b) is the amplitude image of the second overlapped image, (c) is the reference T$_2$ map, (d) is the reconstructed T$_2$ map, (e) is the relative error map of T$_2$, (f) is the reference T$_2$* map, (g) is the reconstructed T$_2$* map, and (h) is the relative error map of T$_2$*. Preferably, in step 4, it can be seen from FIG. 6 that the two acquired images are obviously distorted, because the sequence is easily affected by a non-uniform magnetic field. The reconstruction of parametric maps corrects the distortions desirably. The average relative errors of the reconstructed T$_2$ and T$_2$* maps are 3.45% and 7.88% respectively, indicating high quantitative imaging precision.

The examples of the present specification are described in a progressive manner, and each example focuses on the difference from other examples. For the same or similar parts between the examples, reference may be made to each other. For the system disclosed in the examples, since the system corresponds to the method disclosed in the examples, the description is relatively simple, and reference can be made to the description of the method.

In this specification, several specific examples are used for illustration of the principles and implementations of the disclosure. The description of the foregoing examples is used to help illustrate the method of the disclosure and the core ideas thereof. In addition, those of ordinary skill in the art can make various modifications in terms of specific implementations and scope of application in accordance with the ideas of the disclosure. In conclusion, the content of the present specification shall not be construed as a limitation to the disclosure.

What is claimed is:
1. A method for simultaneous quantitative multiparametric magnetic resonance imaging (MRI), comprising:
generating a preset quantity of training samples for a deep neural network according to an MRI sequence; wherein the MRI sequence comprises a signal excitation part, a shift gradient part, and a data acquisition part;
wherein the preset quantity of the training samples is generated by performing operations for the preset quantity of times, the operations comprise:
randomly generating a geometric figure in a blank rectangular template;
using the geometric figure as a mask, adding an optical image filtered by a filter function to the mask, and randomly assigning various magnetic-resonance parameter values in the optical image;
generating geometric figures repeatedly, until the random geometric figures overlay the entire blank rectangular template, to obtain a virtual imaging object, wherein the virtual imaging object is jointly formed by multiple magnetic-resonance parametric templates;
modeling a magnetic field to obtain a magnetic field model;
modeling a radiofrequency field to obtain a radiofrequency field model;
acquiring data of the virtual imaging object by using the radiofrequency field model, the magnetic field model, and the MRI sequence, to obtain k-space data of the virtual imaging object;
performing Fourier transformation on the k-space data of the virtual imaging object, to obtain overlapped image(s) of the virtual imaging object; and
forming a training sample by using the overlapped image(s) of the virtual imaging object and the multiple magnetic-resonance parametric templates;
training the deep neural network by using the training samples, to obtain a trained deep neural network; and
correcting image distortions due to a non-uniform magnetic field by reconstructing multiple magnetic-resonance parametric maps using the trained deep neural network and k-space data acquired by the MRI sequence.

2. The method for simultaneous quantitative multiparametric MRI according to claim 1, wherein the signal excitation part comprises multiple excitation pulses and is used to generate multiple echo signals; the shift gradient part comprises multiple shift gradients and is used to refocus the multiple echo signals in expected positions in k-space; and the data acquisition part comprises refocusing pulses, phase-encoding gradients and frequency-encoding gradients and is used to collect echo signals.

3. The method for simultaneous quantitative multiparametric MRI according to claim 1, wherein the training the deep neural network by using the training samples, to obtain a trained deep neural network comprises:

inputting the training samples to the deep neural network to obtain output data;
determining whether the number of iterations of the deep neural network reaches a preset value and an error between the output data and target data converges; and
if so, determining that the deep neural network is the trained deep neural network; or
if not, continuing training the deep neural network.

4. The method for simultaneous quantitative multiparametric MRI according to claim 1, wherein the reconstructing multiple magnetic-resonance parametric maps using the trained deep neural network and k-space data acquired by the MRI sequence comprises:
acquiring data of an actual imaging object by using the MRI sequence, to obtain k-space data of the actual imaging object;
performing Fourier transformation on the k-space data of the actual imaging object, to obtain overlapped image(s) of the actual imaging object; and
reconstructing the overlapped image(s) of the actual imaging object by using the trained deep neural network, to obtain multiple magnetic-resonance parametric maps.

5. The method for simultaneous quantitative multiparametric MRI according to claim 1, wherein the modeling a magnetic field to obtain a magnetic field model comprises:
modeling the magnetic field to obtain a magnetic field model $B_0$:

$$B_0 = amp_0 \times (a_0 X + b_0 Y + c_0 XY + d_0 X^2 + e_0 Y^2 + f_0 XY^2 + g_0 X^2 Y)$$

where $amp_0$ controls the deviation degree of the $B_0$ field; $a_0$, $b_0$, $c_0$, $d_0$, $e_0$, $f_0$, and $g_0$ obey a uniform distribution in a range of $[-0.5, 0.5]$; X and Y are coordinate values of a rectangular template of $B_0$ after normalization, and are within a range of $[-1, 1]$.

6. The method for simultaneous quantitative multiparametric MRI according to claim 1, wherein the modeling a radiofrequency field to obtain a radiofrequency field model comprises:
modeling the radiofrequency field to obtain a radiofrequency field model $B_1$:

$$B_1 = amp_1 \times (a_1 X + b_1 Y + c_1 XY + d_1 X^2 + e_1 Y^2) + f_1 + 1$$

where $amp_1$ represents the amplitude of $B_1$, which obeys a uniform distribution in a range of $[0, 0.6]$; $a_1$ and $b_1$ obey a Gaussian distribution with an average value of 0 and a variance of 0.5; $c_1$, $d_1$, and $e_1$ obey a uniform distribution in a range of $[-0.5, 0.5]$; $f_1$ obeys a uniform distribution in a range of $[-0.05, 0.05]$; X and Y are coordinate values of a rectangular template of $B_1$ after normalization, and are within a range of $[-1, 1]$.

7. A system for simultaneous quantitative multiparametric MRI, comprising:
an MRI sequence comprising a signal excitation part, a shift gradient part, and a data acquisition part;
at least one processor; and
a memory storing executable instructions that, when executed by the at least one processor, causes the at least one processor to perform operations comprising:
generating a preset quantity of training samples for a deep neural network according to the MRI sequence,
wherein the preset quantity of the training samples is generated by performing operations for the preset quantity of times, the operations comprise:
randomly generating a geometric figure in a blank rectangular template;
using the geometric figure as a mask, adding an optical image filtered by a filter function to the mask, and randomly assigning various magnetic-resonance parameter values in the optical image;
generating geometric figures repeatedly, until the random geometric figures overlay the entire blank rectangular template, to obtain a virtual imaging object, wherein the virtual imaging object is jointly formed by multiple magnetic-resonance parametric templates;
modeling a magnetic field to obtain a magnetic field model;
modeling a radiofrequency field to obtain a radiofrequency field model;
acquiring data of the virtual imaging object by using the radiofrequency field model, the magnetic field model, and the MRI sequence, to obtain k-space data of the virtual imaging object;
performing Fourier transformation on the k-space data of the virtual imaging object, to obtain overlapped image(s) of the virtual imaging object; and
forming a training sample by using the overlapped image(s) of the virtual imaging object and the multiple magnetic-resonance parametric templates;
training the deep neural network by using the training samples, to obtain a trained deep neural network; and
correcting image distortions due to a non-uniform magnetic field by reconstructing multiple magnetic-resonance parametric maps by using the trained deep neural network and k-space data acquired by the MRI sequence.

8. The system for simultaneous quantitative multiparametric MRI according to claim 7, wherein the reconstructing multiple magnetic-resonance parametric maps using the trained deep neural network and k-space data acquired by the MRI sequence comprises:
acquiring data of an actual imaging object by using the MRI sequence, to obtain k-space data of the actual imaging object;
performing Fourier transformation on the k-space data of the actual imaging object, to obtain overlapped image(s) of the actual imaging object; and
reconstructing the overlapped image(s) of the actual imaging object by using the trained deep neural network, to obtain multiple magnetic-resonance parametric maps.

* * * * *